(12) United States Patent
Sakamoto et al.

(10) Patent No.: US 6,462,418 B2
(45) Date of Patent: Oct. 8, 2002

(54) SEMICONDUCTOR DEVICE HAVING IMPROVED HEAT RADIATION

(75) Inventors: Noriaki Sakamoto; Yoshiyuki Kobayashi; Junji Sakamoto; Yukio Okada; Yusuke Igarashi; Eiju Maehara; Kouji Takahashi, all of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/809,849

(22) Filed: Mar. 16, 2001

(65) Prior Publication Data

US 2002/0027290 A1 Mar. 7, 2002

(30) Foreign Application Priority Data

Sep. 6, 2000 (JP) ........................................ 2000-269467

(51) Int. Cl.⁷ .............................................. H01L 29/40
(52) U.S. Cl. ...................................... 257/753; 257/783
(58) Field of Search .................................. 257/687, 768, 257/666, 659, 660, 428, 681, 668; 438/238, 118, 783, 628, 644, 654, 57

(56) References Cited

U.S. PATENT DOCUMENTS 5,633,529 A * 5/1997 Otsuki
5,976,912 A   11/1999 Fukutomi et al.
6,201,292 B1 * 3/2001 Yagi et al.

OTHER PUBLICATIONS

CSP Technology, and mounting material and device supporting the technology–special issue of Denshi Zairyo.

* cited by examiner

Primary Examiner—David Nelms
Assistant Examiner—Long K. Tran
(74) Attorney, Agent, or Firm—Fish & Richardson P.C.

(57) ABSTRACT

As conductive patterns 11A to 11D are formed burying in a insulating resin 10 and a conductive foil 20 is formed being half-etched, thickness of the device is made thin. As an electrode for radiation 11D is provided, a semiconductor device superior in radiation is provided.

7 Claims, 6 Drawing Sheets

SEMICONDUCTOR DEVICE HAVING IMPROVED HEAT RADIATION

BACKGROUND OF THE INVENTION

The present invention relates to a semiconductor device and a method for manufacturing the same, particularly a semiconductor device radiating excellently heat from the semiconductor device and a method for manufacturing the same.

Description of the Related Art

In recent years, use of IC package for portable,equipment or small, hi-density mounting equipment progresses, and the conventional IC package and its concept of mounting are largely changing. These details are described in *CSP technology, and mounting material and device supporting the technology*—special issue of DENSHI ZAIRYO (p.22, Sep. 1998).

FIG. 9 is a structure adopting a flexible sheet 50 as an interposer board, a copper foil pattern 51 is put on the flexible sheet through adhesive, and an IC chip is fixed. There is a pad for bonding 53 formed at periphery of the IC chip as the conductive pattern 51. A pad for connecting solder ball 54 is formed through a conductive path 51B formed in one body(integrally) with the pad for bonding 53.

At backside of the pad for connecting solder ball 54, an opening 56 where the flexible sheet is opened, and through the opening 56, a solder ball 55 is formed. The entire body is sealed with an insulating resin 58 using the flexible sheet 50 as a board. Symbol 57 is a bonding wire.

However the flexible sheet formed on a rear surface of IC chip is very expensive, and there are problems that cost rises, thickness of the package becomes thick, and weight increases.

There is a problem that heat resistance from a back face of the IC chip to a back face of the package becomes large in a supporting board because the supporting board comprises material other than metal. For said supporting board, there is a flexible sheet, a ceramic board, or a printed board. A heat conduction path comprising material superior in heat conduction is the bonding wire 57, the copper foil 51, and the solder ball 55, the above supporting board has a structure not to radiate fully at driving. Therefore there is a problem that driving current does not flow fully because of temperature rise of IC chip at driving.

SUMMARY OF THE INVENTION

The invention is carried out in view of the above problems, and intends to obtain a reliable semiconductor device having a small package and a good radiation characteristics.

First, the problems are solved having a pad provided facing to a bonding electrode of a semiconductor chip, an electrode for radiation provided at an arranged area of said semiconductor chip, a insulating adhesion means provided on said electrode for radiation, said semiconductor chip fixed to said insulating adhesion means and electrically connected to said pad, and a insulating resin sealing (molding) said semiconductor chip so as to expose a back face of said pad and said insulating adhesion means and to make in one body.

Second, the problem is solved by that said insulating adhesion means comprises an adhesion sheet or adhesive.

Third, the problem is solved by that said semiconductor element is mounted in face-up type and that said pad and said bonding electrode are connected with fine metal wires (bonding wires).

Fourth, the problem is solved by providing: plural bonding pads provided so as to surround one area; external connection electrodes extended in one body with said bonding pads; an electrode for radiation provided at said one area; a insulating adhesion means provided at said electrode for radiation; a semiconductor chip fixed through said insulating adhesion means; bonding wires connecting said bonding electrodes and said bonding pads on said semiconductor chip; and a insulating resin covering said semiconductor chip, said bonding pads, said electrode for radiation, said external connection electrodes, and said bonding wires and exposing back faces of said external connection electrodes, back faces of said electrodes for radiation, and back faces of said insulating adhesion means.

Fifth, the problem is solved by providing: plural pads provided so as to surround one area; an electrode for radiation provided at said one area; a insulating adhesion means provided at said electrode for radiation; a semiconductor chip fixed through said insulating adhesion means; connecting means connecting said bonding electrodes and said pads on said semiconductor chip; and a insulating resin covering said semiconductor chip, said bonding pads, and said connection means, and exposing back faces of said bonding pads and said insulating adhesion means; wherein the back face of said bonding pads are used as the external connection electrode.

Sixth, the problem is solved by that said connection means comprises a bonding wire or brazing material.

Seventh, the problem is solved by that a side face of said pad, bonding pad, or external connection electrode comprises a curved structure.

Eighth, the problem is solved by preparing a conductive foil and half-etching so that a conductive pattern is formed in projection shape;

providing an insulating adhesion means so as to fill in an isolation trench formed by said half-etching;

fixing a semiconductor chip through said insulating adhesion means so as to connect said conductive pattern electrically and;

providing a insulating resin at said conductive foil so as to seal said semiconductor chip and said conductive pattern; and removing a back face of said conductive foil so as to exposing a back face of said insulating adhesion means and to separate as said conductive pattern.

Ninth, the problem is solved by preparing a conductive foil and half-etching so that a conductive pattern comprising at least a pad and an electrode for radiation is formed in projection shape;

forming an insulating adhesion means so as to cover said electrode for radiation and fill in an isolation trench adjacent to the electrode;

fixing a semiconductor chip through said insulating adhesion means so as to connect said conductive pattern electrically and;

providing a insulating resin at said conductive foil so as to seal said semiconductor chip and said conductive pad; and removing a back face of said conductive foil so as to exposing a back face of said insulating adhesion means and to separate said conductive pattern.

By providing the semiconductor device, it is possible to transfer heat of a semiconductor chip to an electrode for radiation. As a conductive pattern including the electrode for radiation is formed without using a supporting board, it is possible to decrease cost and to make thickness of the semiconductor device thin.

DESCRIPTION OF THE PREFERRED EMBODIMENTS

Figure 1A:
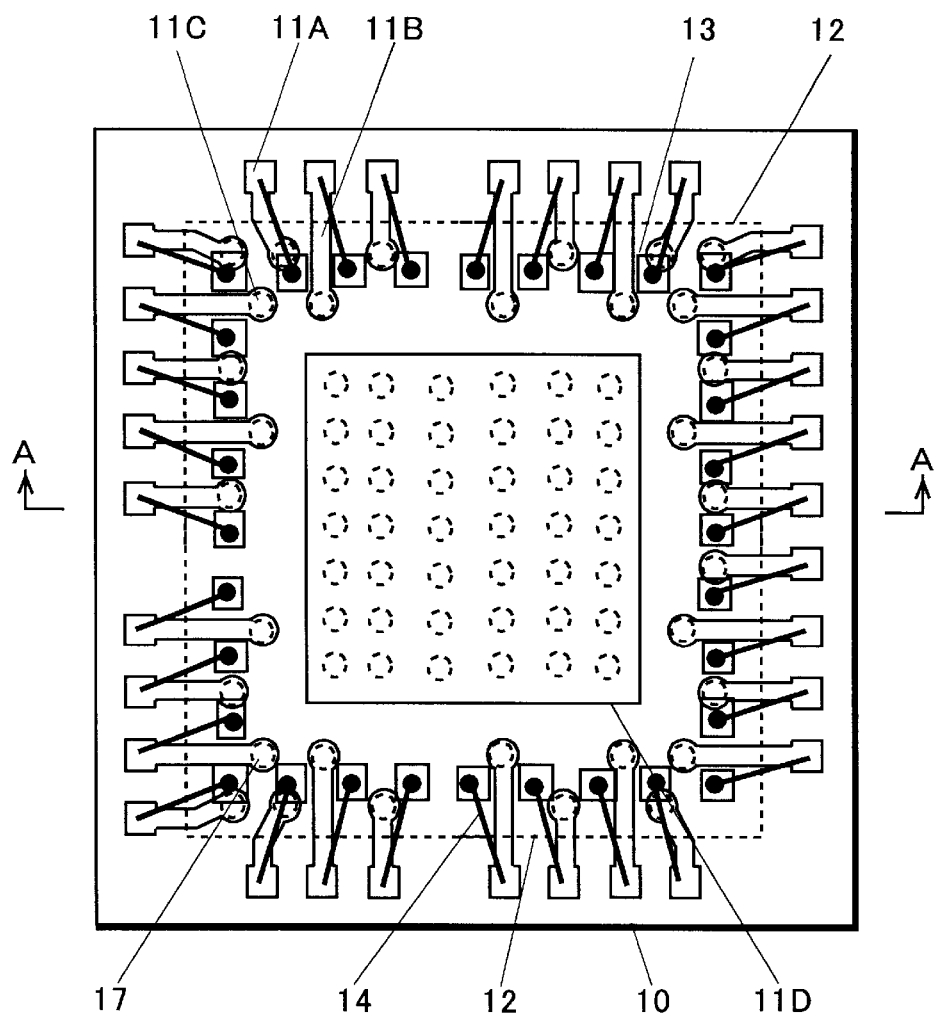
FIG. 1A, 1B is a view describing the semiconductor device of the invention.
Figure 1B:
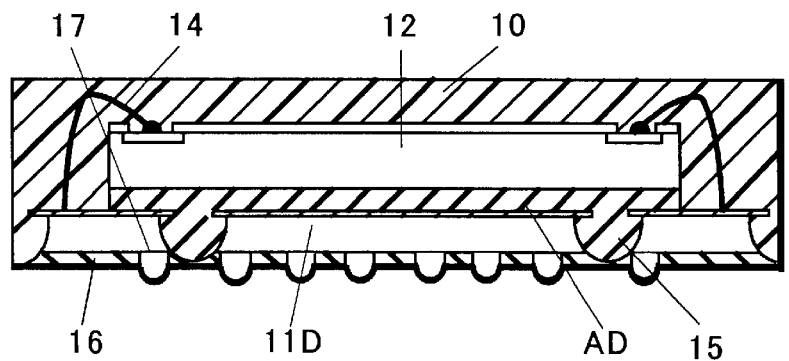

First, a semiconductor device of the invention is described referring FIG. 1. FIG. 1A is a plan view of the semiconductor device, and FIG. 1B is a section view cut with A—A line.

FIG. 1 shows a insulating resin 10 buried with the following chips. They are pads 11A, conductive paths 11B in one body with the pads 11A, external connection electrodes 11C provided at the other ends of the conductive paths 11B in one body with the conductive paths 11B. Further an electrode for radiating 11D provided at one area surrounded by the conductive patterns 11A, 11B, and 11C and a semiconductor chip 12 provided on the electrode for radiating 11D are buried. The semiconductor chip 12 is fixed to the electrode for radiating 11D through a insulating adhesion means AD, and is shown with dotted line in FIG. 1A.

A bonding electrode 13 of the semiconductor chip 12 and the pad 11A are electrically connected through a bonding wire 14.

Side face of said conductive pattern 11A to 11D is etched with non-anisotropy, and has a curved structure because of being formed with wet etching so as to generate anchor effect by the curved structure.

The structure consists of four materials: the semiconductor chip 12, plural conductive patterns 11A to 11C, the electrode for radiation 11D, the insulating adhesion means AD, and the insulating resin 10 burying them. In arranged area of the semiconductor chip 12, said insulating adhesion means AD is formed on and between the conductive patterns 11A to 11D, particularly is provided in the isolation trench 15 formed by etching so as to expose the back face. The insulating resin 10 seals all including these materials. Said pads 11A and semiconductor chip 12 are supported by the insulating resin 10.

For the insulating adhesion means, adhesive comprising insulating material and insulating sheet of adhesiveness are desirable. As clear in the description below, material is desirable to bond entire wafer and to pattern by photolithography. For the insulating resin, thermosetting resin such as epoxy resin and thermoplastic resin such as polyimide resin and polyphenylenesulfide are used. All kinds of resin are used if they are resins hardening using a die and covering by dipping and painting. For the conductive patterns 11A to 11D, conductive foil of Cu as main material, conductive foil of Al as main material, Fe—Ni alloy, laminated product of Cu—Al, or laminated product of Al—Cu—Al is used. Of course, even other material is possible to use, particularly conductive material easy to etch and easy to evaporate by laser is desirable. Considering half-etching ability, forming ability of plating, and thermal stress, conductive material of Cu as main material formed by rolling is desirable.

The invention has a characteristic to prevent remove of the conductive pattern because the insulating resin 10 and the insulating adhesion means AD are filled into even said isolation trench 15. By carrying out non-anisotropic etching using dry etching or wet etching for etching, the side faces of pads 11A are made into curved structure so as to generate anchor effect. As the result, the structure that the conductive patterns 11A to 11D do not come out (remove) from the insulating resin 10(package) is realized.

Further the back faces of the conductive patterns 11A to 11D expose at the back face of the package. Accordingly the back face of the electrode 11D for radiation is fixed with the electrode on the mounting board. The structure can radiate heat generating from the semiconductor chip 12 on the electrode of the mounting board, can prevent temperature rise of the semiconductor chip 12, and can increase driving current of the semiconductor chip 12. The electrode for radiation 11C and the semiconductor chip 12 may be connected electrically.

Because the conductive patterns 11A to 11D are supported by insulating resin 10 in the semiconductor device, a supporting board is not need. This construction is a characteristic of the invention. As described at the prior art, the conductive path of the conventional semiconductor device is supported by a supporting board (flexible sheet, printed board, or ceramic board), or supported by a lead frame, the construction which is not need originally is added. However the circuit device consists of necessary minimum components and does not need the supporting board so that the device has a characteristic to be thin, light, and inexpensive because of low material cost.

At the back face of the package, the conductive patterns 11A to 11D expose. By covering brazing material such as solder for example, at the area, the brazing material can get wet thickly because area of the electrode for radiation 11D is broad. Therefore brazing material of the back face of the external connection electrode 11C is not wet at the electrode of the mounting board at fixing on the mounting board, so it is assumed to become bad connection.

To solve that, a insulating film 16 is formed at the back face of the semiconductor device 15. Circles of dotted line shown FIG. 1A show the external connection electrodes 11C and electrodes for radiation 11D exposing from the insulating film 16. That is, as the insulating film 16 covers portions except the circles and size of circle portions is substantially same size, thickness of brazing material formed here is substantially same. This is similar as after solder printing and after reflow. This is similar about conductive paste such as Ag, Au, Ag—Au, Ag—Pd and so on. By the structure, bad quality of the electrical connection means 23 are depressed. An exposing portion 17 of the electrode for radiation 11D may be formed larger than exposing size of the external connection electrode 11C considering radiation of the semiconductor chip. As all of the external connection electrodes 11C are substantially same size, all area of the external connection electrodes 11C may be exposed at entire area, and a part of the back face of the electrode for radiation 11D may be exposed from the insulating film 16 with substantially same size.

By providing the insulating film 16, it is possible to extend the conductive path provided at the mounting board to the back face of the semiconductor device. Although the conductive path provided at the mounting board side is generally arranged going around the fixed area of said semiconductor device, forming said insulating film 16 can arrange without going around. Further as the insulating resin 10 and the insulating adhesion means AD project from the conductive pattern, a gap is formed between the conductive path of the mounting board side and the conductive pattern so as to prevent short.

The method for manufacturing shows the method for manufacturing of the semiconductor chip 15 shown in FIG. 1, and FIG. 2 to FIG. 6 are section views corresponding to A—A line of FIG. 1A.

Figure 2:
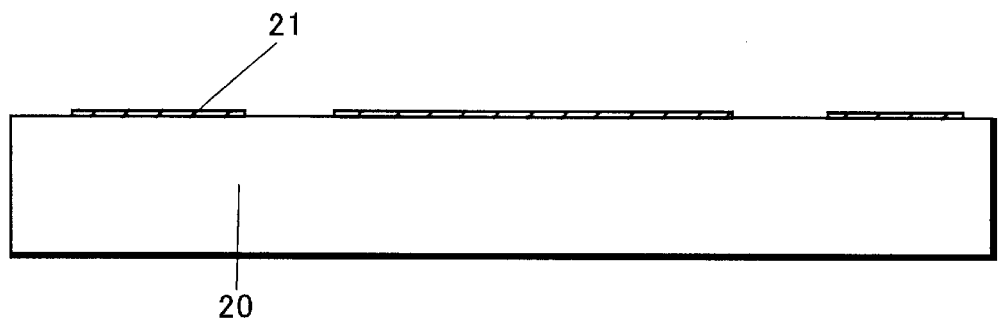
FIG. 2 is a view describing the method for manufacturing the semiconductor device of the invention.

First, a conductive foil 20 is provided as FIG. 2. Thickness thereof is desirably 10 μm to 300 μm, here rolled copper foil of 70 μm is used. Next on the front face of the conductive foil 20, a conductive film 21 or a photo resist is formed as etching-resist.

The pattern is same pattern as the pads 11A in FIG. 1A, the conductive paths 11B, the external connection electrode 11C, and the electrodes for radiation 11D. In the case of using the photo resist instead of the conductive film 21, a conductive film such as Au, Ag, Pd or Ni is formed at a part corresponding to at least pad in the lower layer of the photo resist. This is provided to make bonding possible. (Refer FIG. 2 about the above.)

Next, a conductive foil 20 is half-etched through said conductive film 21 or photo resist. Depth of etching may be thinner than thickness of conductive foil 20. The thinner the depth of etching, forming the finer pattern is possible.

By half-etching, conductive patterns 11A to 11D appear at surface of the conductive foil 20 in projection shape. As above-mentioned, here Cu foil formed by roll and made of Cu as main material is used for the conductive foil 20. For the conductive foil, conductive foil made of AL, conductive foil made of Fe—Ni alloy, layered product of Cu—AL, or layered product of Al—Cu—Al may be used. Especially the layered product of Al—Cu—Al prevents bend appearing by difference of coefficient of thermal expansion.

At part corresponding to dotted line of FIG. 1, a insulating adhesion means AD is formed. The insulating adhesion means AD is provided at an isolation trench 15 between the electrode of radiation 11D and the external connection electrode 11C, at an isolation trench 15 between the electrode of radiation 11D and the conductive path 11B, and on them. (Refer FIG. 3 about the above.)

Next, a semiconductor chip 12 is fixed at one area providing the insulating adhesion means AD, a bonding electrode 13 of the semiconductor chip 12 and the bonding pad 11A are electrically connected. In the figure, as the semiconductor chip 12 is mounted in face up type, a bonding wire 14 is used for the connection means.

In the bonding, the bonding pads 11A are in one body with the conductive foil 20, and further a back face of the conductive foil 20 contacts face of table of a bonding machine because the back face is flat. Therefore if the conductive foil 20 is entirely fixed to the bonding table, there is not position shift of the bonding pads 11A, and bonding energy is transferred efficiently to the bonding wire 14 and the bonding pads 11A. Therefore the bonding wire 14 is connected improving fixing strength thereof. Fixing the bonding table is possible by providing plural vacuum suction holes at entire face of the table for example. The conductive foil 21 may be pushed from upper side.

The semiconductor chip is mounted without using the supporting board, and height of the semiconductor chip 12 is arranged low as thickness as the supporting board. Therefore it is possible that thickness of the package is made thin. (Refer to FIG. 4 about the above.)

A insulating resin 10 is formed so as to cover the conductive patterns 11A to 11D formed by half-etched, the semiconductor chip 12, and the bonding wire 14. For the insulating resin, both of thermoplasticity and thermosetting property may be used.

Transfer molding, injection molding, dipping, or painting realizes the resin. For the resin material, thermosetting resin such as epoxy resin is realized by transfer molding and thermoplastic resin such as liquid polymer and polyphenylenesulfide is realized by injection molding.

In the mode for carrying out, thickness of the insulating resin is adjusted so as to cover 100 μm upper from an upper limit face of the bonding wire 14. The thickness may be made thick or thin considering strength of the semiconductor device.

In the injection of resin, as the conductive patterns 11A to 11D are in one body with the sheet-shape conductive foil 20, position of the conductive patterns 11A to 11D does not shift at all as long as the conductive foil 20 does not shift.

As above-mentioned, in the insulating resin 10, the conductive patterns 11A to 11D formed as projection and the semiconductor chip 12 are buried, and the conductive foil 20 of lower part than the projection exposes at the back face. (Refer FIG. 5 about the above.)

Next, the conductive foil 20 exposing at the back face of the insulating resin 10 is removed and the conductive patterns 11A to 11D are individually separated.

Various methods are considered for the separating process, that is, the back face may be separated removing by etching or grinding by polishing or grinding. Both of them may be used. There is a problem that shavings of the conductive foil 20 and bur-shape rolled metal extended thin to outside cut into the insulating resin 10 and the insulating adhesion means AD at grinding till the insulating resin 10 exposes for example. Therefore separating the conductive pattern by etching, the device is formed without that metal of the conductive foil 20 cuts into the insulating resin 10 existing between the conductive pattern 11A to 11D and the insulating adhesion means AD. Thus short between the conductive pattern 11A to 11D of fine interval is prevented. (Refer FIG. 5 about the above.)

In the case that plural units becoming the semiconductor device 15 are formed, dicing process is added after the separating process.

Although the units are separated individually using the dicing machine here, it is possible by chocolate breaking, pressing, and cutting.

Figure 6:
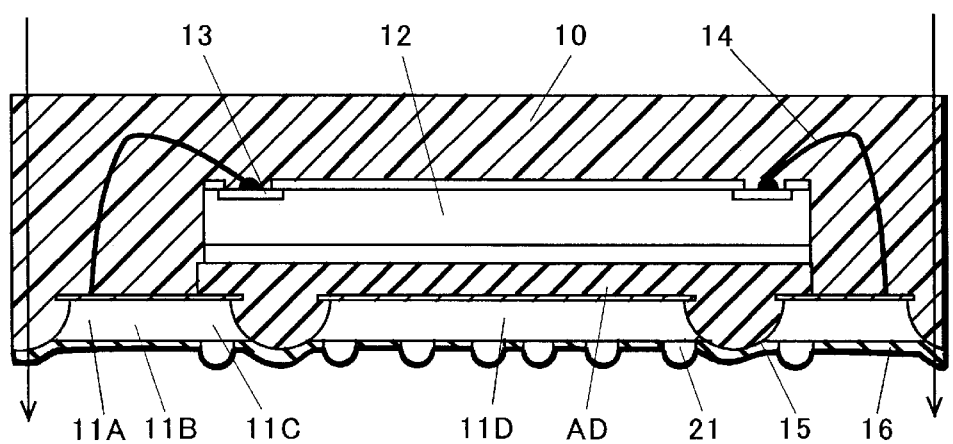
FIG. 6 is a view describing the method for manufacturing the semiconductor device of the invention.

Here the insulating film 16 is formed on the conductive patterns 11A to 11D exposing at the back face separated and is patterned so as to exposes the parts shown in circle of dotted line of FIG. 1A, and after that, is diced along an arrow shown in FIG. 6 to be each of the semiconductor devices.

The solder 21 may be formed before or after dicing.

The above method for manufacturing realizes a light, thin, short, small package where a semiconductor chip buried in insulating material.

Figure 3:
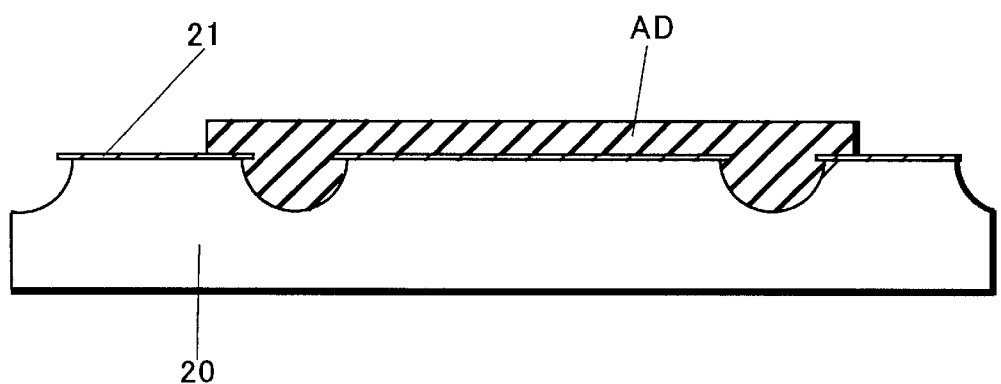
FIG. 3 is a view describing the method for manufacturing the semiconductor device of the invention.
Figure 4:
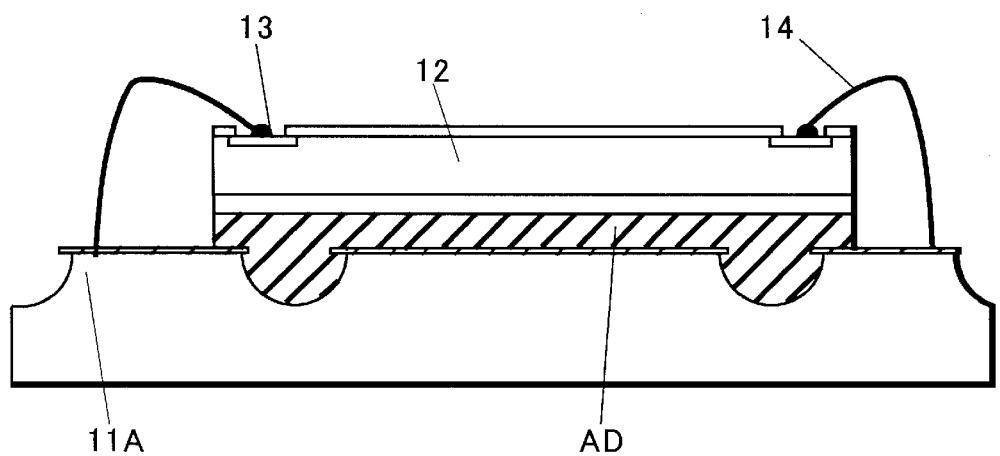
FIG. 4 is a view describing the method for manufacturing the semiconductor device of the invention.
Figure 5:
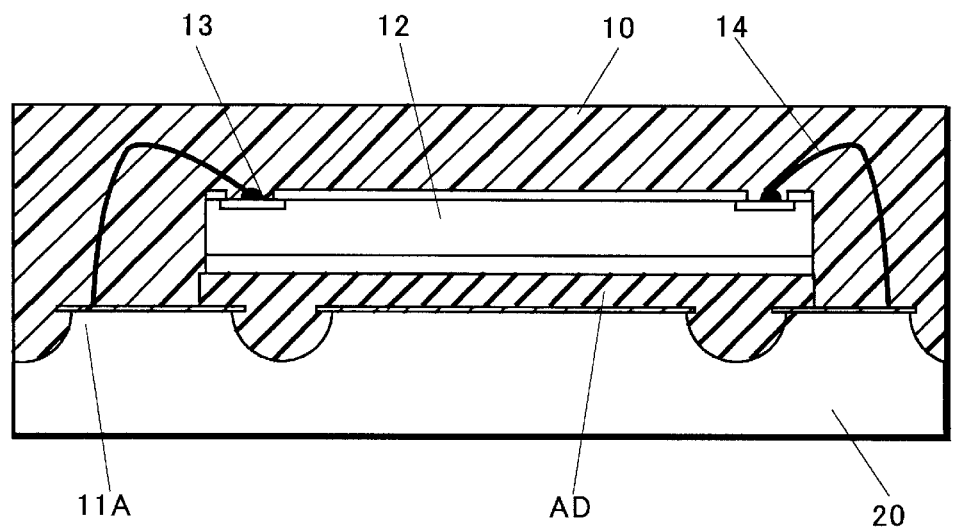
FIG. 5 is a view describing the method for manufacturing the semiconductor device of the invention.

The insulating adhesion means AD shown in FIG. 3 and FIG. 4 may be bonded at the stage of wafer before the semiconductor 12 is individually separated. That is, if sheet-shaped adhesive is formed on the back face of wafer at the stage wafer and the wafer is cut with the sheet at dicing, the process forming the insulating adhesion means AD on the conductive foil 20, shown in FIG. 3, is not need.

Figure 7:
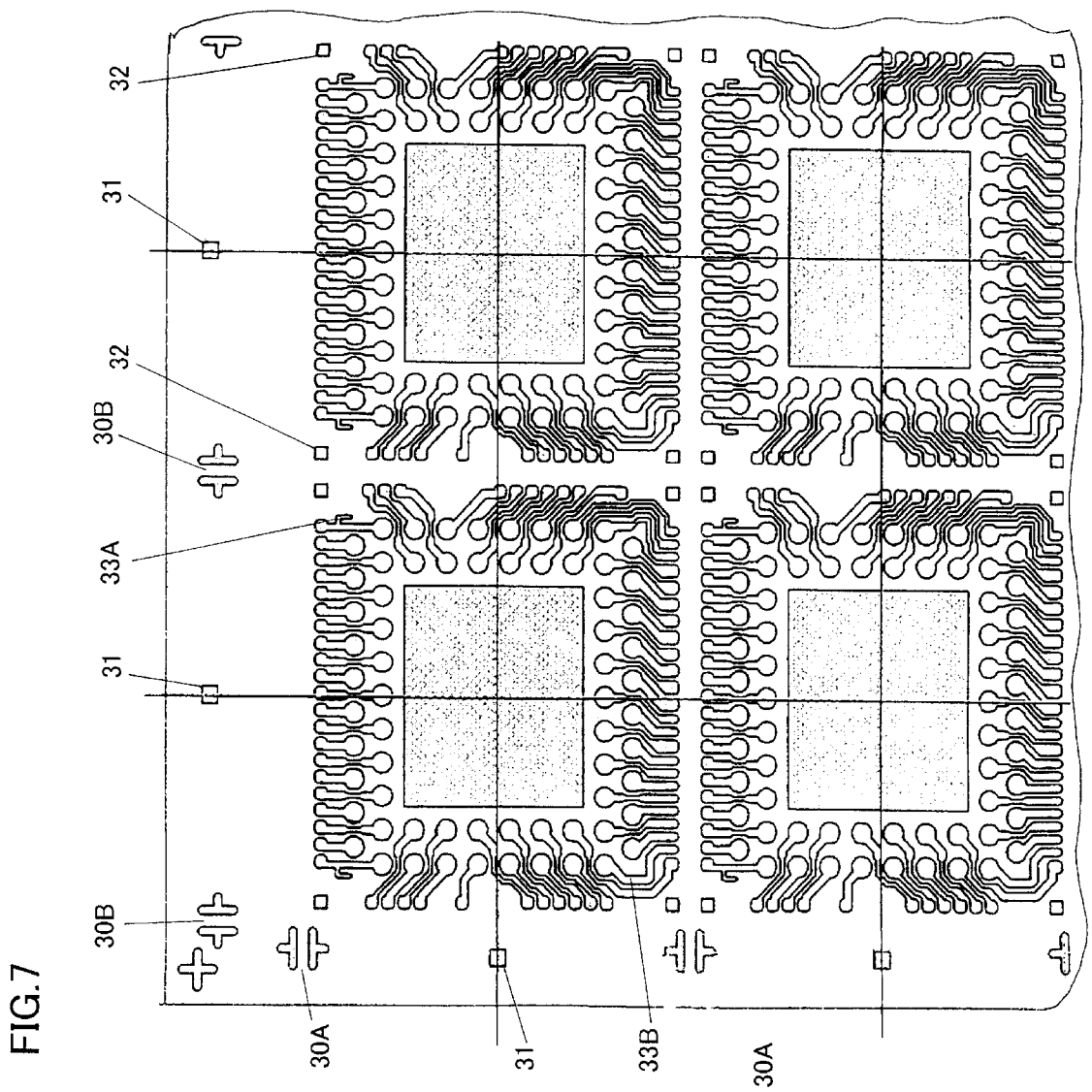
FIG. 7 is a view describing the conductive pattern used for the semiconductor device of the invention.

FIG. 7 shows a conductive pattern formed on the conductive foil 20. Here four units are formed vertically, and horizontally eight units are formed so as to have a shape like lead frame.

Symbols 30A and 30B are marks showing position of dicing line, and between two lines dicing blade is arranged so as to separate the semiconductor device individually. Symbols 31 and 32 are indexing marks. L shape lines shown with symbols 33A and 33B show corner portion of the chip. At the corner portion, the corner of the chip is arranged and fixed.

Next, effect generating by the above method for manufacturing is described.

First, as the conductive pattern is half-etched and supported in one body of the conductive foil, a board used for supporting past is removed.

Second, as the pad half-etched to make projection is formed on the conductive foil, it is possible to make the pad fine. Therefore it is possible to make width and gap of the pad narrow so as to form a small package in plan size.

Third, as the device consists of necessary minimum components: the conductive pattern, the semiconductor chip, the connection means, and sealing material, useless material is removed so as to realize thin semiconductor device extremely depressing cost.

Fourth, as the pads are formed becoming projection by half-etching and individually separated after sealing, tie bar and hanging lead are not need. Therefore forming and cutting tie bar (hanging lead) is not need at all in the invention.

Fifth, as the conductive foil is removed from the back face of the insulating resin after the conductive pattern becoming the projection is buried in the insulating resin and is separated, bur of resin generating between leads as the conventional lead framed is removed.

Sixth, as the semiconductor is fixed to the electrode for radiation through the insulating adhesive means and the electrode for radiation exposes from the back face thereof, heat generating from the semiconductor device is efficiently radiated from the back face thereof. By mixing the under-fill material with filler such as Si oxide film and aluminum oxide, radiation of the device is more improved. By unifying the filler size, it is possible that gap between the semiconductor chip 12 and the conductive pattern is kept uniform.

Third Mode for Carrying out Describing a Semiconductor Device

Figure 8A:
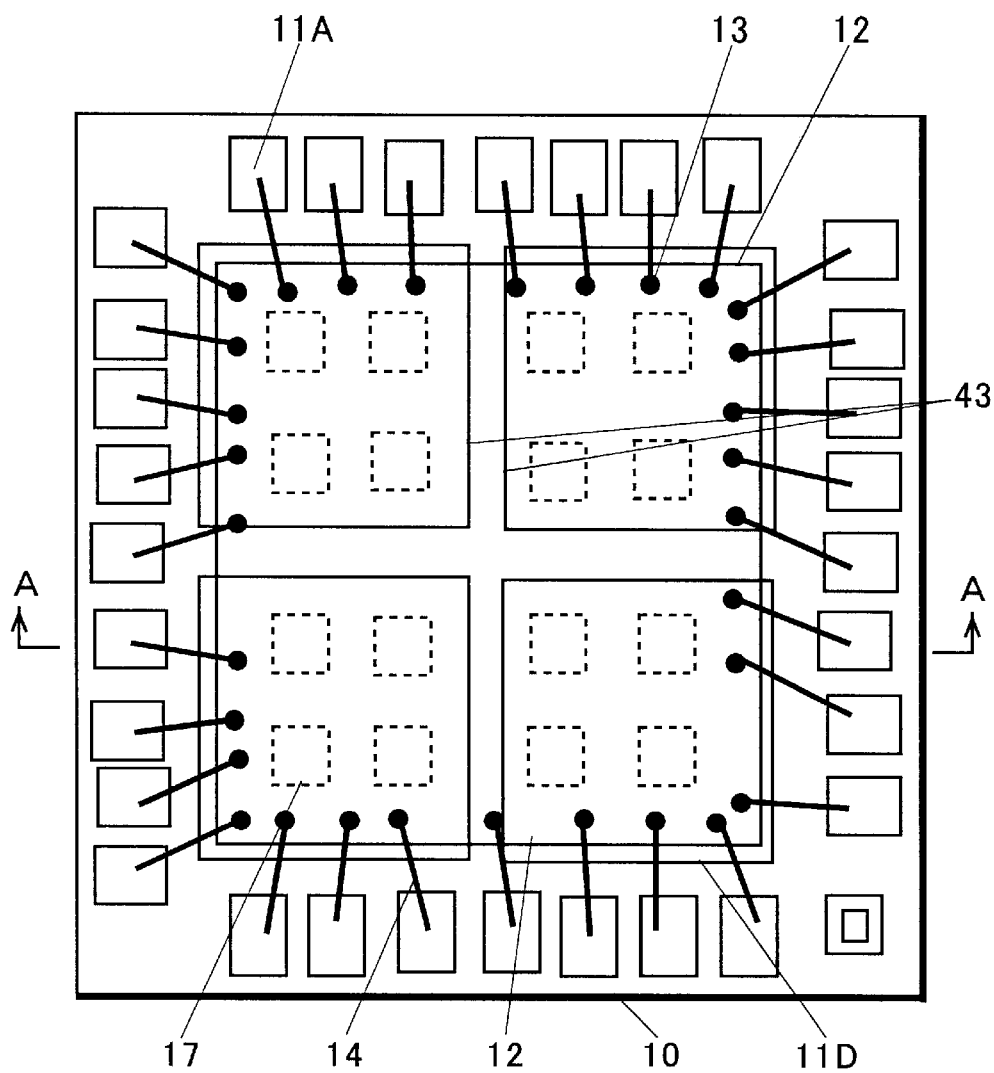
FIG. 8A, 8B is a view describing the semiconductor device of the invention.
Figure 8B:
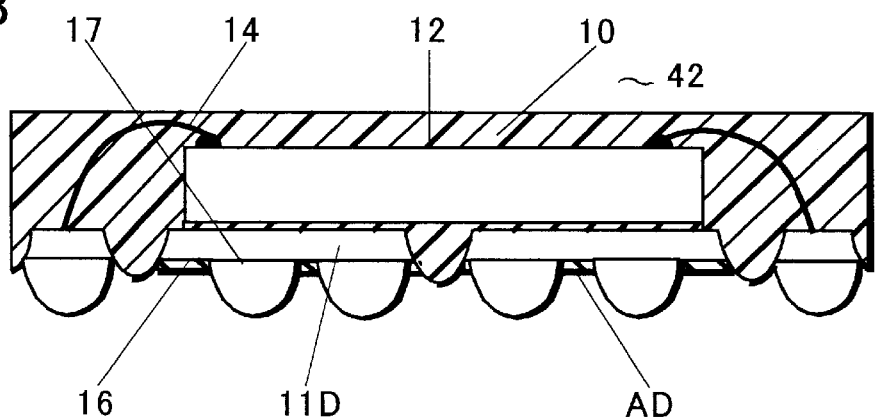
Figure 9A:
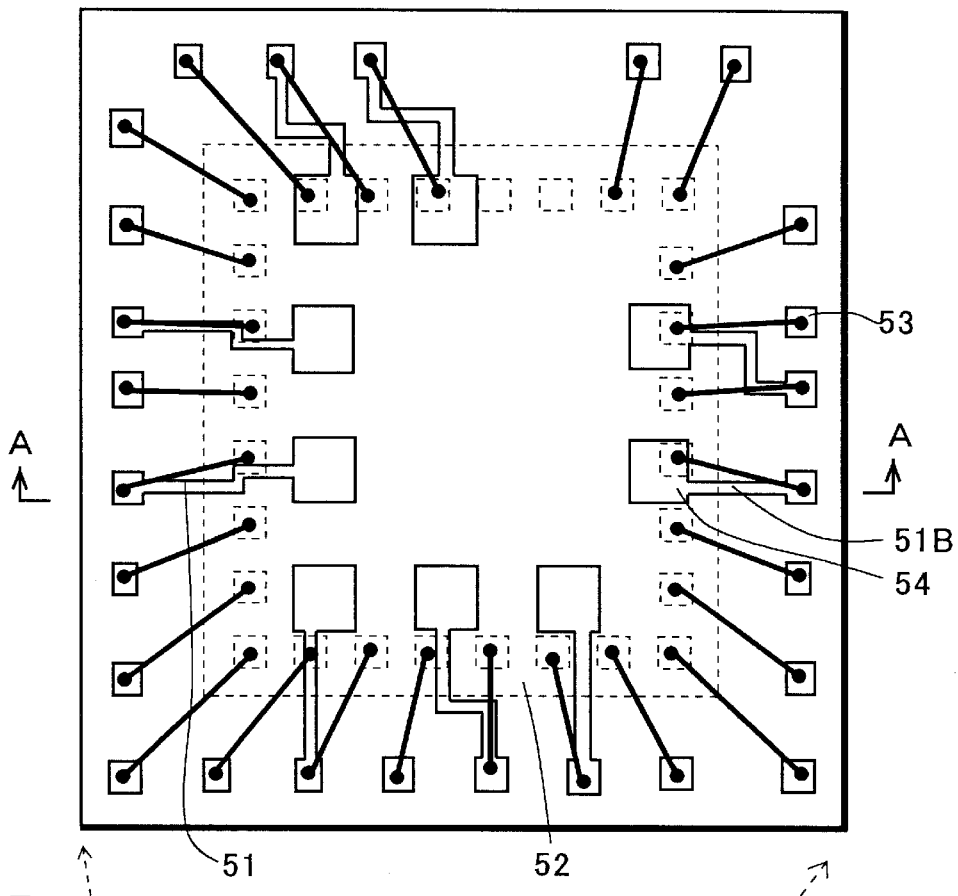
FIG. 9A, 9B is a view describing the conventional semiconductor device.
Figure 9B:
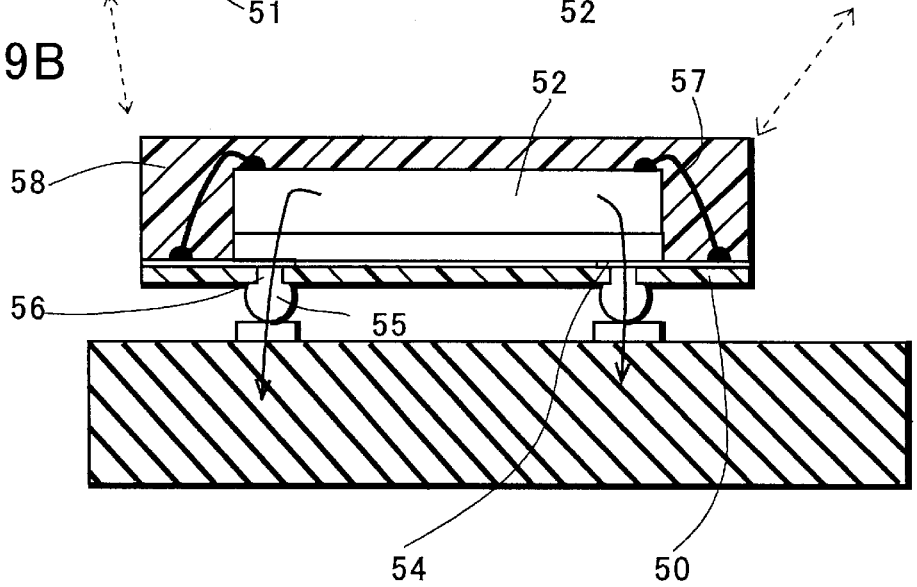

FIG. 8 shows the semiconductor device 42. FIG. 8A is a plan view of the device, and FIG. 8B is a section view cut by A—A line.

Although the pad 11A is formed in one body with the conductive path 11B and the external connection electrode 11C in FIG. 1, here the back face of the pad 11A becomes the external connection electrode.

As the back face of the pad 11A is formed in rectangle, the pattern exposing from the insulating film 16 is formed in same pattern as said rectangle. The trenches 43 are formed so that the electrode 11D for radiation and chip 12 can be adhered appropriately by filling the insulating adhesion means into said trenches. Thereby the electrode 11D for radiation is divided to plural.

As clear from the above description, in the invention, even the conductive foil (or conductive foil) where the conductive pattern formed in island shape has thickness is buried in the insulating adhesion means and the insulating resin. As the electrode for radiation positioning at the back face of the semiconductor chip, it is possible to improve radiation of the semiconductor chip. Further as the supporting board is not used, it is possible to realize a thin and light package.

The device consists of necessary minimum components of the conductive pattern, the semiconductor chip, and the insulating resin, and becomes a circuit device useless for resources. Therefore extra components do not exist till completion, and a semiconductor device decreasing cost thereof extremely.

What is claimed is:

1. A semiconductor device, comprising:

at least an electrode for radiation having front and back faces;

a plurality of bonding pads each having front and back faces, said plurality of bonding pads provided to surround said electrode for radiation, and said plurality of bonding pads are separated from said electrode for radiation by isolation trench;

an insulating adhesion means adhered on the front face of said electrode for radiation and filled in the isolation trench, said insulating adhesion means integrally supports said plurality of bonding pads and said electrode for radiation;

a semiconductor chip fixed on the front face of said electrode for radiation and the isolation trench by said insulating adhesion means and electrically connected to said plurality of bonding pads;

a connecting means connecting bonding electrodes of said semiconductor chip and said plurality of bonding pads; and an insulating resin sealing said semiconductor chip so as to expose said back faces of said plurality of bonding pads, said back face of said electrode for radiation and said insulating adhesion means.

2. A semiconductor device according to claim 1, wherein said insulating adhesion means selected from the group consisting of an adhesion sheet or an adhesive.

3. A semiconductor device according to claim 1, wherein said semiconductor chip is mounted face-up and said plurality of bonding pads and said bonding electrode are connected with a bonding wire.

4. A semiconductor device according to claim 1, wherein said connection means selected from the group consisting of a bonding wire or brazing material.

5. A semiconductor device according to claim 1, wherein side electrode for radiation and said plurality of bonding pads are formed from a common conductive foil.

6. A semiconductor device according to claim 1, wherein the isolation trench is formed by etching, and side faces of electrode for radiation and said plurality of bonding pads have curved structures.

7. A semiconductor device according to claim 1, further comprising external connection electrodes provided on said back face of said electrode for radiation and said back face of said plurality of bonding pads, wherein each of said external connection electrodes have substantially the same size.

* * * * *